(12) United States Patent
Mears et al.

(10) Patent No.: US 6,891,188 B2
(45) Date of Patent: May 10, 2005

(54) SEMICONDUCTOR DEVICE INCLUDING BAND-ENGINEERED SUPERLATTICE

(75) Inventors: Robert J. Mears, Wellesley, MA (US); Jean Augustin Chan Sow Fook Yiptong, Waltham, MA (US); Marek Hytha, Brookline, MA (US); Scott A. Kreps, Southborough, MA (US); Ilija Dukovski, Newton, MA (US)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 10/717,374

(22) Filed: Nov. 19, 2003

(65) Prior Publication Data

US 2004/0262628 A1 Dec. 30, 2004

Related U.S. Application Data

(63) Continuation of application No. 10/647,060, filed on Aug. 22, 2003, which is a continuation-in-part of application No. 10/603,696, filed on Jun. 26, 2003, and a continuation-in-part of application No. 10/603,621, filed on Jun. 26, 2003.

(51) Int. Cl.$^7$ .............................................. H01L 29/06
(52) U.S. Cl. .............................. 257/15; 257/15; 257/17
(58) Field of Search .............................. 257/15, 17, 13, 257/19, 9, 18, 77, 190

(56) References Cited

U.S. PATENT DOCUMENTS

| 4,485,128 A | 11/1984 | Dalal et al. ................. 427/85 |
| 4,594,603 A | 6/1986 | Holonyak, Jr. ................ 357/16 |
| 4,937,204 A | 6/1990 | Ishibashi et al. ............ 437/110 |

(Continued)

FOREIGN PATENT DOCUMENTS

| GB | 2347520 | 9/2000 | ............ G02B/5/18 |
| JP | 61145820 A | 7/1986 | ............ H01L/21/20 |
| JP | 61220339 A | 9/1986 | ......... H01L/21/322 |
| WO | 99/63580 | 12/1999 | ............. H01L/3/00 |
| WO | 02/103767 | 12/2002 | ............ H01L/21/20 |

OTHER PUBLICATIONS

Xuan Luo et al.; "Chemical Design of Direct–Gap Light–Emitting Silicon", published Jul. 25, 2002 by The American Physical Society; vol. 89, No. 7.

R. Tsu; University of North Carolina at Charlotte, "Phenomena in Silicon Nanostructure Devices"; published Sep. 6, 2000 © Springer–Verlag 2000.

P.D. Ye et al., "GaAs MOSFET with Oxide Gate Dielectric Grown by Atomic Layer Deposition"; © 2003 Agere Systems, Mar. 2003.

Novikov et al.; "Silicon–based Optoelectronics" © 1999–2003 by John Wiley & Sons, Inc.; pp/ 1–6.

*Primary Examiner*—Michael Tran
*Assistant Examiner*—Thinh T Nguyen
(74) *Attorney, Agent, or Firm*—Allen, Dyer, Doppelt, Milbrath & Gilchrist, P.A.

(57) ABSTRACT

A semiconductor device includes a superlattice that, in turn, includes a plurality of stacked groups of layers. The device may also include regions for causing transport of charge carriers through the superlattice in a parallel direction relative to the stacked groups of layers. Each group of the superlattice may include a plurality of stacked base semiconductor monolayers defining a base semiconductor portion and an energy band-modifying layer thereon. Moreover, the energy-band modifying layer may include at least one non-semiconductor monolayer constrained within a crystal lattice of adjacent base semiconductor portions. Accordingly, the superlattice may have a higher charge carrier mobility in the parallel direction than would otherwise be present.

36 Claims, 9 Drawing Sheets

U.S. PATENT DOCUMENTS

| | | | |
|---|---|---|---|
| 4,969,031 A | 11/1990 | Kobayashi et al. ............ 357/63 |
| 5,055,887 A | 10/1991 | Yamazaki ...................... 357/4 |
| 5,216,262 A | 6/1993 | Tsu .............................. 257/17 |
| 5,357,119 A | 10/1994 | Wang et al. .................. 257/18 |
| 5,683,934 A | 11/1997 | Candelaria ................. 437/134 |
| 5,684,817 A | 11/1997 | Houdre et al. ................ 372/45 |
| 5,994,164 A | 11/1999 | Fonash et al. ................ 438/97 |
| 6,058,127 A | 5/2000 | Joannopoulos et al. ....... 372/92 |
| 6,274,007 B1 | 8/2001 | Smirnov et al. ............ 204/192 |
| 6,281,518 B1 | 8/2001 | Sato ............................. 257/13 |
| 6,281,532 B1 | 8/2001 | Doyle et al. ................. 257/288 |
| 6,326,311 B1 | 12/2001 | Ueda et al. ................. 438/694 |
| 6,344,271 B1 | 2/2002 | Yadav et al. ................ 428/402 |
| 6,350,993 B1 | 2/2002 | Chu et al. ...................... 257/19 |
| 6,376,337 B1 | 4/2002 | Wang et al. ................. 438/478 |
| 6,433,354 B1 * | 8/2002 | Kuan et al. .................... 257/15 |
| 6,436,784 B1 | 8/2002 | Allam ......................... 438/380 |
| 6,472,685 B2 | 10/2002 | Takagi ......................... 257/77 |
| 6,498,359 B2 | 12/2002 | Schmidt et al. .............. 257/190 |
| 6,501,092 B1 | 12/2002 | Nikonov et al. ............... 257/29 |
| 6,566,679 B2 | 5/2003 | Nikonov et al. ............... 257/29 |
| 6,621,097 B2 | 9/2003 | Nikonov et al. ............... 257/17 |
| 2003/0034529 A1 | 2/2003 | Fitzgerald et al. ........... 257/369 |
| 2003/0057416 A1 | 3/2003 | Currie et al. .................. 257/19 |
| 2003/0162335 A1 | 8/2003 | Yuki et al. ................... 438/151 |
| 2003/0215990 A1 | 11/2003 | Fitzgerald et al. ........... 438/172 |

\* cited by examiner

SEMICONDUCTOR DEVICE INCLUDING BAND-ENGINEERED SUPERLATTICE

RELATED APPLICATIONS

This application is a continuation of Ser. No. 10/647,060 filed Aug. 22, 2003, which is a continuation-in-part of U.S. patent applications Ser. Nos. 10/603,696 and 10/603,621 filed on Jun. 26, 2003, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391–402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

In view of the foregoing background, it is therefore an object of the present invention to provide a semiconductor device having a higher charge carrier mobility, for example.

This and other objects, features and advantages in accordance with the invention are provided by a semiconductor device comprising a superlattice including a plurality of stacked groups of layers. More particularly, the device may also include regions for causing transport of charge carriers through the superlattice in a parallel direction relative to the stacked groups of layers. Each group of layers of the superlattice may comprise a plurality of stacked base semiconductor monolayers defining a base semiconductor portion, and an energy band-modifying layer thereon. Moreover, the energy-band modifying layer may comprise at least one non-semiconductor monolayer constrained within a crystal lattice of adjacent base semiconductor portions so that the superlattice has a higher charge carrier mobility than would otherwise be present. The superlattice may also have a common energy band structure therein.

The charge carriers may comprise at least one of electrons and holes. In some preferred embodiments, each base semiconductor portion may comprise silicon, and each energy band-modifying layer may comprise oxygen. Each energy band-modifying layer may be a single monolayer thick, and each base semiconductor portion may be less than eight monolayers thick, such as two to six monolayers thick, for example, in some embodiments.

As a result of the band engineering, the superlattice may further have a substantially direct energy bandgap, as may especially advantageous for opto-electronic devices. The superlattice may further comprise a base semiconductor cap layer on an uppermost group of layers.

In some embodiments, all of the base semiconductor portions may be a same number of monolayers thick. In other embodiments, at least some of the base semiconductor portions may be a different number of monolayers thick. In still other embodiments, all of the base semiconductor portions may be a different number of monolayers thick. Each non-semiconductor monolayer is desirably thermally stable through deposition of a next layer to thereby facilitate manufacturing.

Each base semiconductor portion may comprise a base semiconductor selected from the group consisting of Group IV semiconductors, Group III–V semiconductors, and Group II–VI semiconductors. In addition, each energy band-modifying layer may comprise a non-semiconductor selected from the group consisting of oxygen, nitrogen, fluorine, and carbon-oxygen.

The higher mobility may result from a lower conductivity effective mass. This lower conductivity effective mass may be less than two-thirds the conductivity effective mass than would otherwise occur. Of course, the superlattice may further comprise at least one type of conductivity dopant therein.

DETAILED DESCRIPTION OF THE PREFERRED EMBODIMENTS

Figure 1:
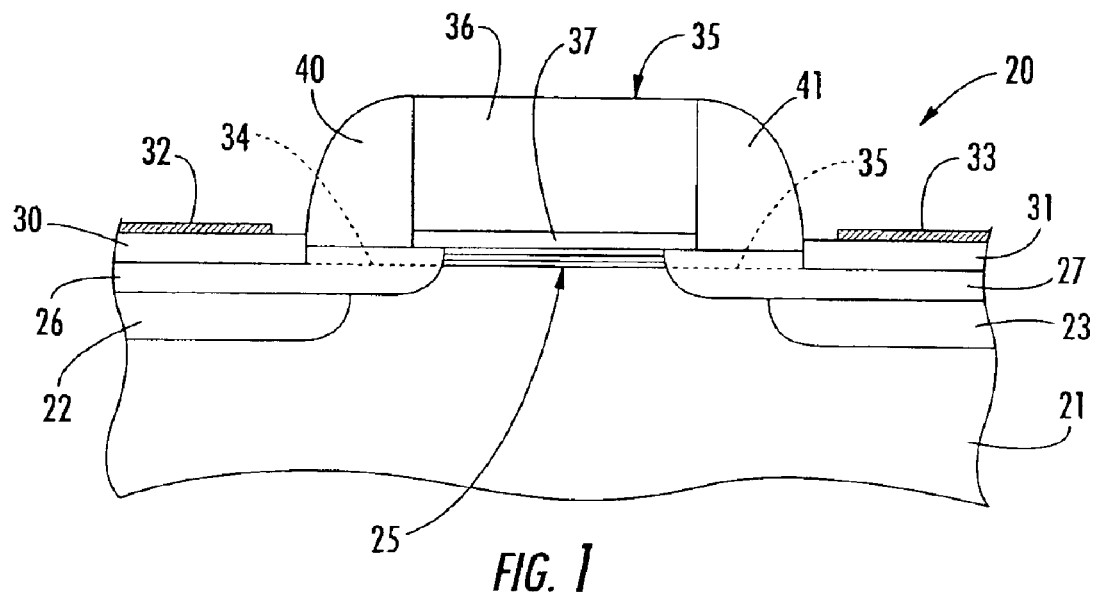
FIG. 1 is a schematic cross-sectional view of a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notation is used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material for a channel region in a CMOS device. A planar MOSFET 20 including the superlattice 25 in accordance with the invention is now first described with reference to FIG. 1. One skilled in the art, however, will appreciate that the materials identified herein could be used in many different types of semiconductor devices, such as discrete devices and/or integrated circuits.

The illustrated MOSFET 20 includes a substrate 21, source/drain regions 22, 23, source/drain extensions 26, 27, and a channel region therebetween provided by the superlattice 25. Source/drain silicide layers 30, 31 and source/drain contacts 32, 33 overlie the source/drain regions as will be appreciated by those skilled in the art. Regions indicated by dashed lines 34, 35 are optional vestigial portions formed originally with the superlattice, but thereafter heavily doped. In other embodiments, these vestigial superlattice regions 34, 35 may not be present as will also be appreciated by those skilled in the art. A gate 35 illustratively includes a gate insulating layer 37 adjacent the channel provided by the superlattice 25, and a gate electrode layer 36 on the gate insulating layer. Sidewall spacers 40, 41 are also provided in the illustrated MOSFET 20.

Applicants have identified improved materials or structures for the channel region of the MOSFET 20. More specifically, the Applicants have identified materials or structures having energy band structures for which the appropriate conductivity effective masses for electrons and/or holes are substantially less than the corresponding values for silicon.

Figure 2:
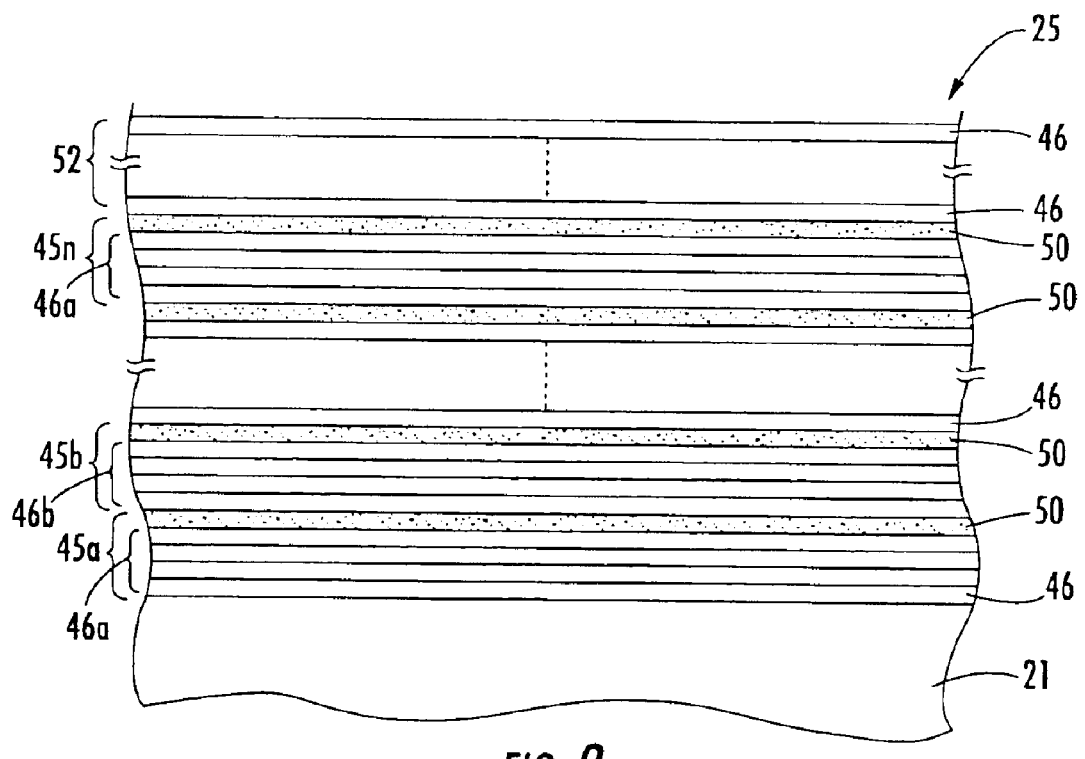
FIG. 2 is a greatly enlarged schematic cross-sectional view of the superlattice as shown in FIG. 1.
Figure 3:
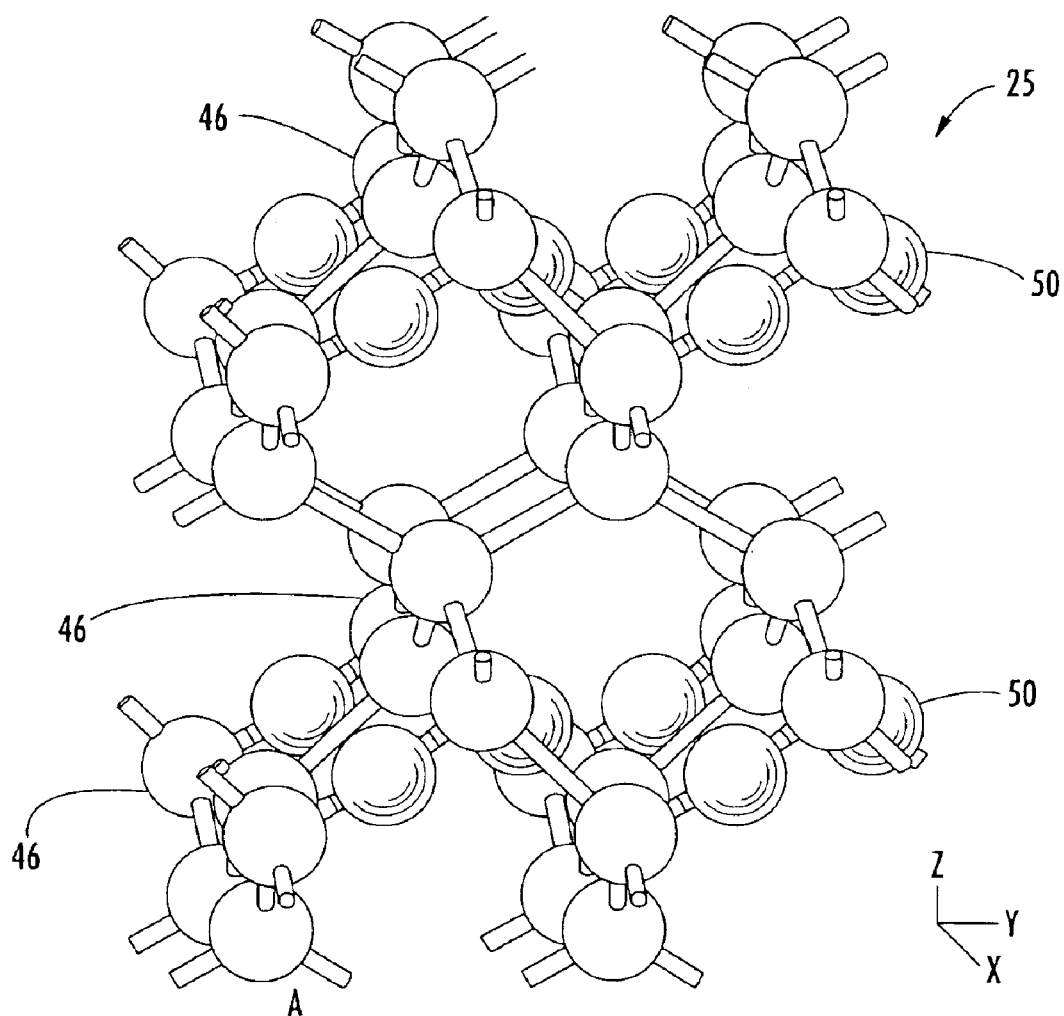
FIG. 3 is a perspective schematic atomic diagram of a portion of the superlattice shown in FIG. 1.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a–45n arranged in stacked relation as perhaps best understood with specific reference to the schematic cross-sectional view of FIG. 2.

Each group of layers 45a–45n of the superlattice 25 illustratively includes a plurality of stacked base semiconductor monolayers 46 defining a respective base semiconductor portion 46a–46n and an energy band-modifying layer 50 thereon. The energy band-modifying layers 50 are indicated by stippling in FIG. 2 for clarity of explanation.

The energy-band modifying layer 50 illustratively comprises one non-semiconductor monolayer constrained within a crystal lattice of adjacent base semiconductor portions. In other embodiments, more than one such monolayer may be possible. Applicants theorize without wishing to be bound thereto that energy band-modifying layers 50 and adjacent base semiconductor portions 46a–46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure. It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for optoelectronic devices, for example, as described in further detail below.

As will be appreciated by those skilled in the art, the source/drain regions 22, 23 and gate 35 of the MOSFET 20 may be considered as regions for causing the transport of charge carriers through the superlattice in a parallel direction relative to the layers of the stacked groups 45a–45n. Other such regions are also contemplated by the present invention.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a–46n may comprise a base semiconductor selected from the group consisting of Group IV semiconductors, Group III–V semiconductors, and Group II–VI semiconductors. Of course, the term Group IV semiconductors also includes Group IV–IV semiconductors as will be appreciated by those skilled in the art.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied. In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 2 and 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art.

Figure 4:
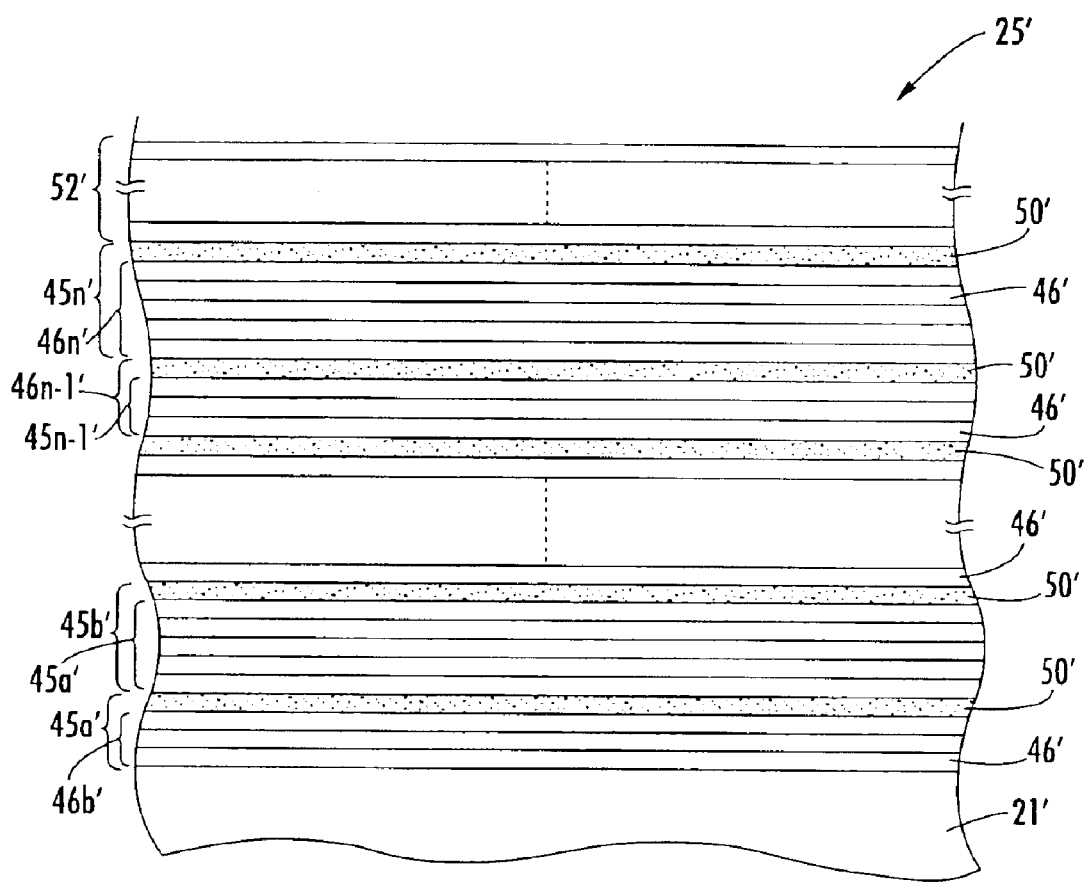
FIG. 4 is a greatly enlarged schematic cross-sectional view of another embodiment of a superlattice that may be used in the device of FIG. 1.

Indeed, referring now additionally to FIG. 4 another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25' The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 5A:
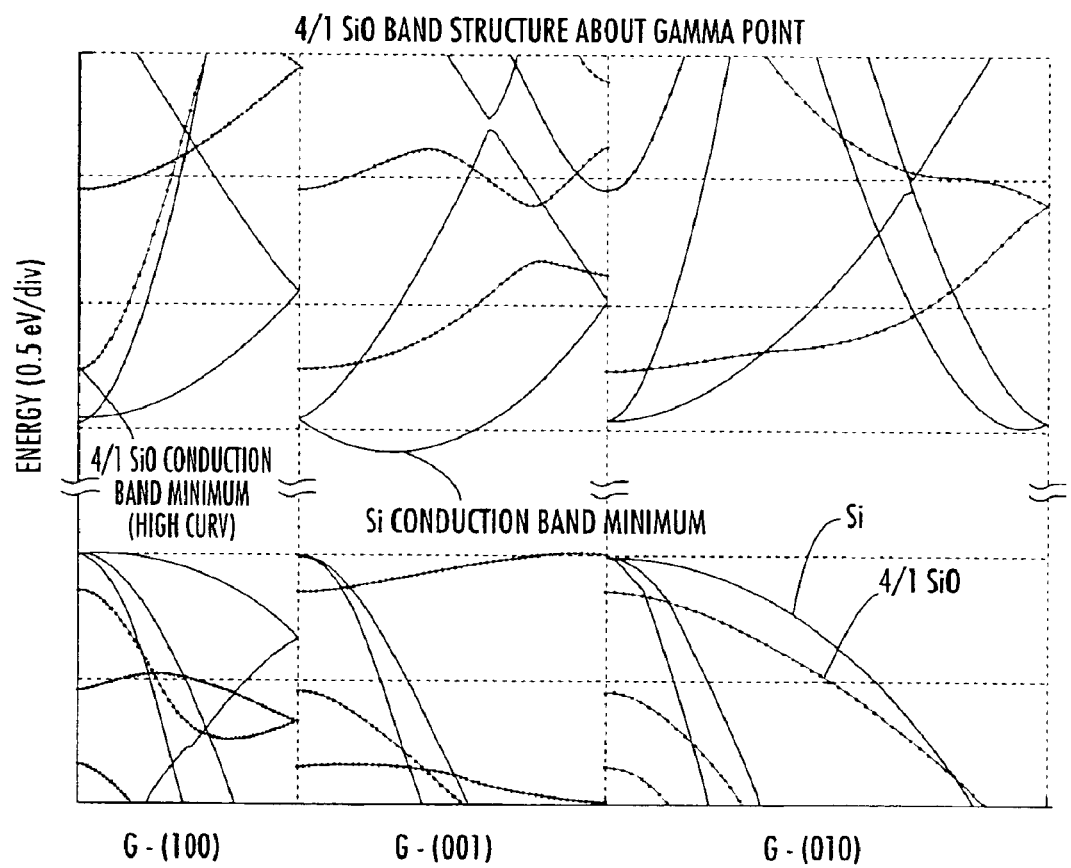
FIG. 5A is a graph of the calculated band structure from the gamma point (G) for both bulk silicon as in the prior art, and for the 4/1 Si/O superlattice as shown in FIGS. 1–3.
Figure 5B:
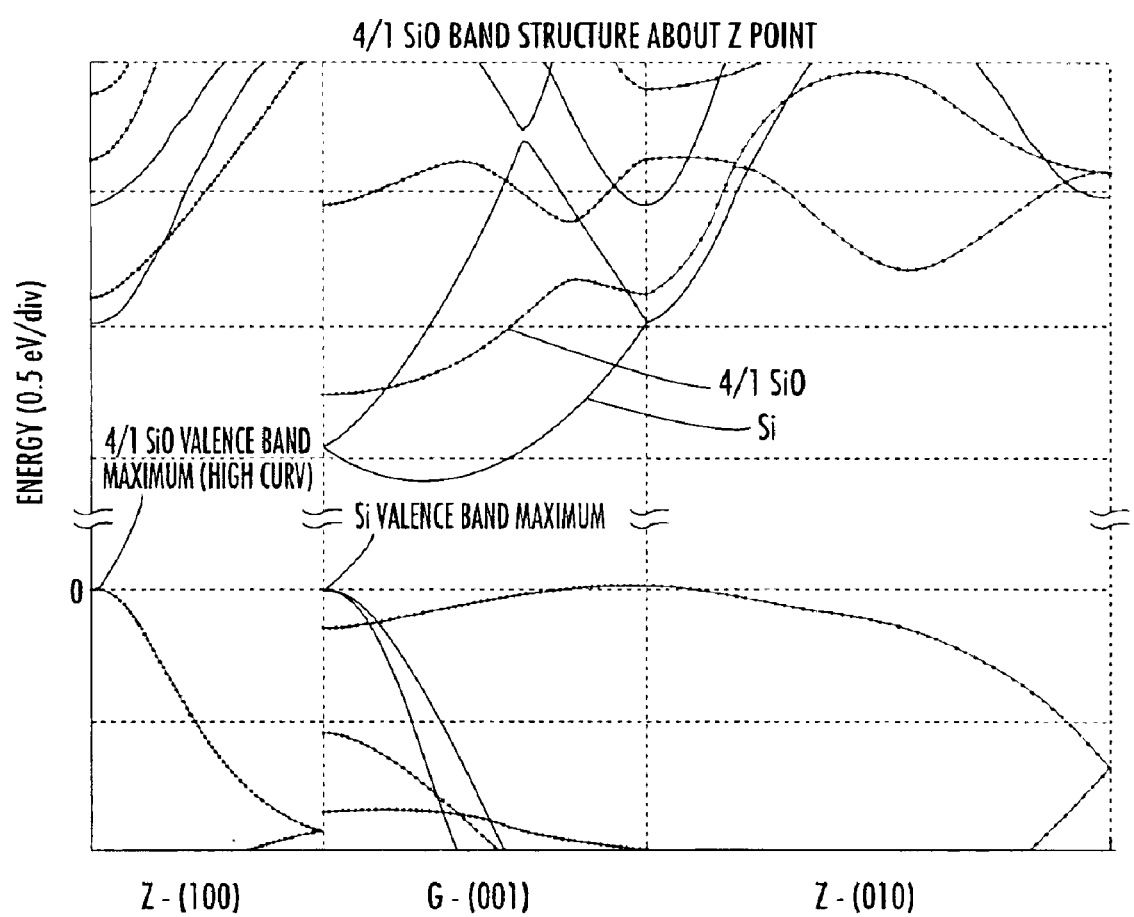
FIG. 5B is a graph of the calculated band structure from the Z point for both bulk silicon as in the prior art, and for the 4/1 Si/O superlattice as shown in FIGS. 1–3.
Figure 5C:
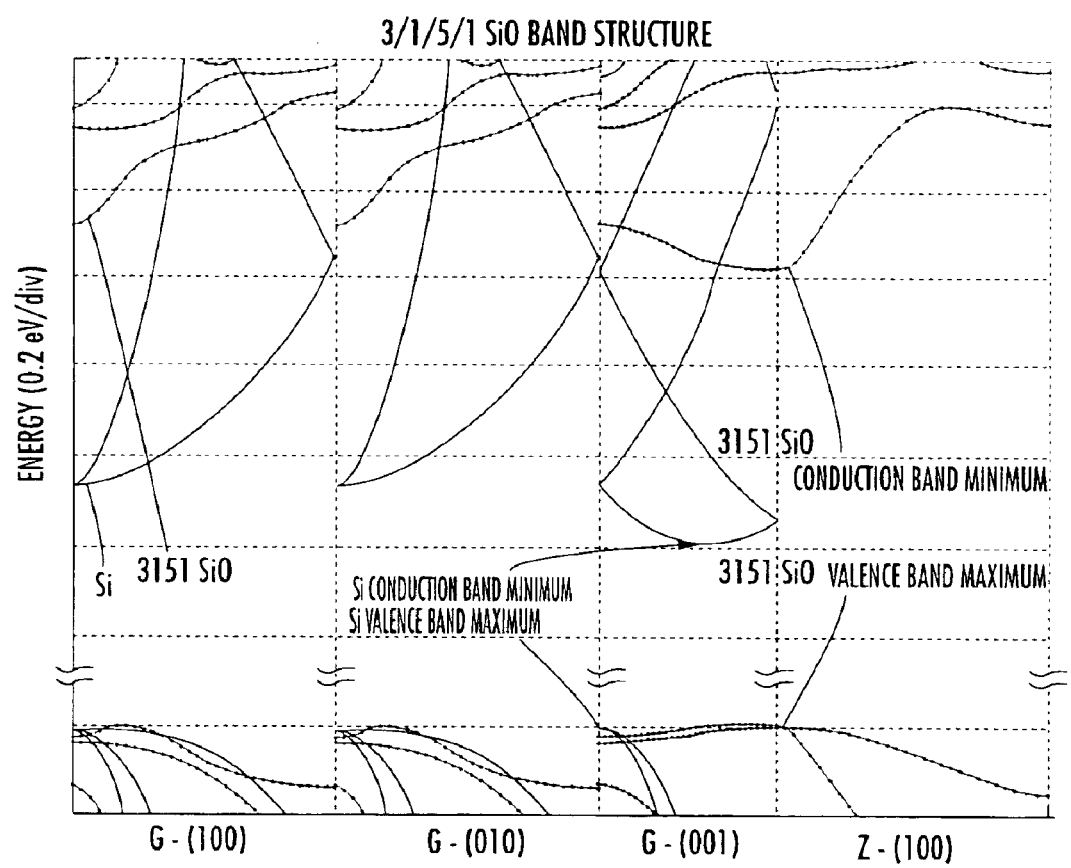
FIG. 5C is a graph of the calculated band structure from both the gamma and Z points for both bulk silicon as in the prior art, and for the 5/1/3/1 Si/O superlattice as shown in FIG. 4.

In FIGS. 5A–5C band structures calculated using Density Functional Theory (DFT) are presented. It is well known in the art that DFT underestimates the absolute value of the bandgap. Hence all bands above the gap may be shifted by an appropriate "scissors correction". However the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIGS. 1–3 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 5B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 5C shows the calculated band structure from the both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point. Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 6A:
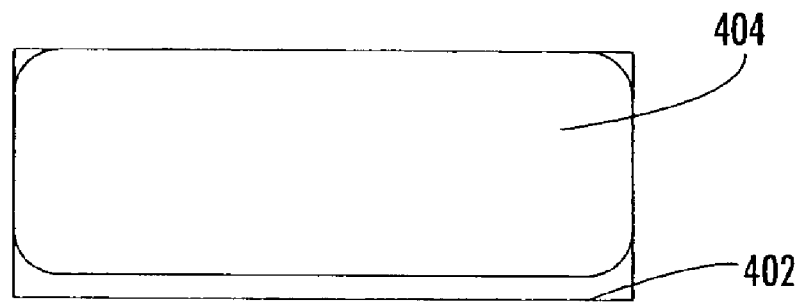
FIGS. 6A–6H are schematic cross-sectional views of a portion of another semiconductor device in accordance with the present invention during the making thereof.
Figure 6B:
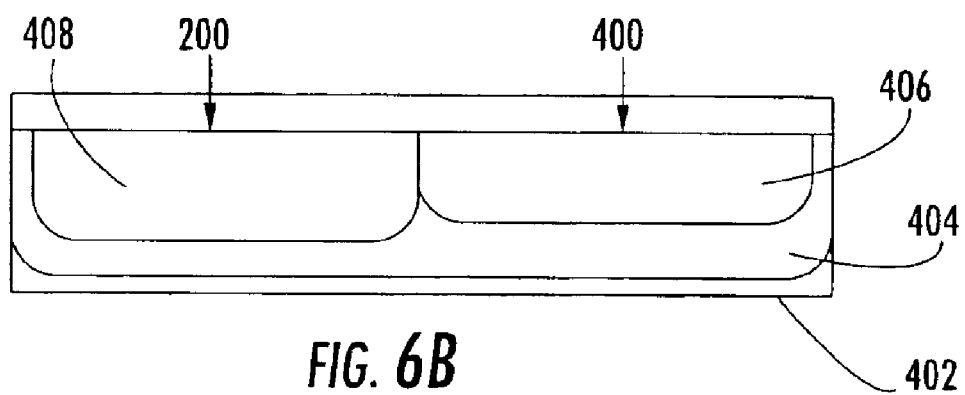

Referring now additionally to FIGS. 6A–6H, a discussion is provided of the formation of a channel region provided by the above-described superlattice 25 in a simplified CMOS fabrication process for manufacturing PMOS and NMOS transistors. The example process begins with an eight-inch wafer of lightly doped P-type or N-type single crystal silicon with <100> orientation 402. In the example, the formation of two transistors, one NMOS and one PMOS will be shown. In FIG. 6A, a deep N-well 404 is implanted in the substrate 402 for isolation. In FIG. 6B, N-well and P-well regions 406, 408, respectively, are formed using an $SiO_2/Si_3N_4$ mask prepared using known techniques. This could entail, for example, steps of n-well and p-well implantation, strip, drive-in, clean, and re-growth. The strip step refers to removing the mask (in this case, photoresist and silicon nitride). The drive-in step is used to locate the dopants at the appropriate depth, assuming the implantation is lower energy (i.e. 80 keV) rather than higher energy (200–300 keV). A typical drive-in condition would be approximately 9–10 hrs. at 1100–1150° C. The drive-in step also anneals out implantation damage. If the implant is of sufficient energy to put the ions at the correct depth then an anneal step follows, which is lower temperature and shorter. A clean step comes before an oxidation step so as to avoid contaminating the furnaces with organics, metals, etc. Other known ways or processes for reaching this point may be used as well.

Figure 6C:
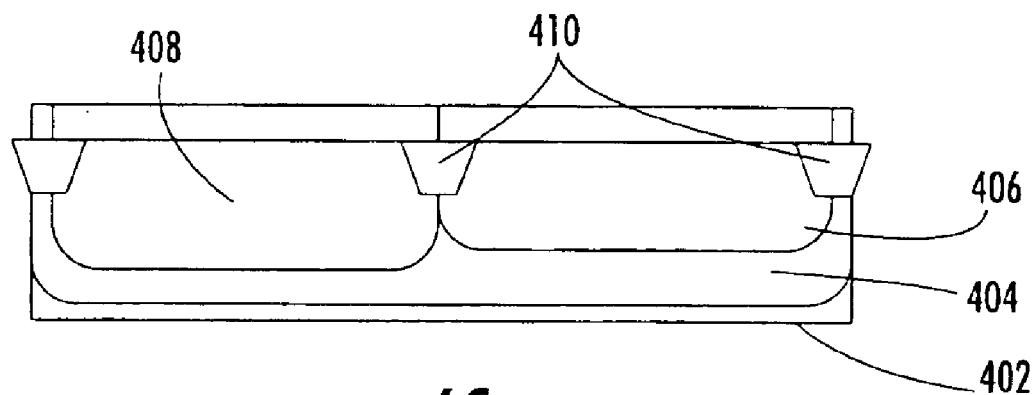
Figure 6D:
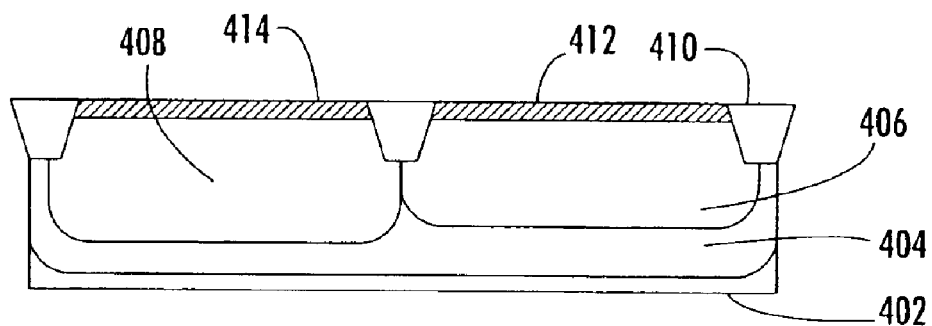

In FIGS. 6C–6H, an NMOS device will be shown in one side 200 and a PMOS device will be shown in the other side 400. FIG. 6C depicts shallow trench isolation in which the wafer is patterned, the trenches 410 are etched (0.3–0.8 um), a thin oxide is grown, the trenches are filled with $SiO_2$, and then the surface is planarized. FIG. 6D depicts the definition and deposition of the superlattice of the present invention as the channel regions 412, 414. An $SiO_2$ mask (not shown) is formed, a superlattice of the present invention is deposited using atomic layer deposition, an epitaxial silicon cap layer is formed, and the surface is planarized to arrive at the structure of FIG. 6D.

The epitaxial silicon cap layer may have a preferred thickness to prevent superlattice consumption during gate oxide growth, or any other subsequent oxidations, while at the same time reducing or minimizing the thickness of the silicon cap layer to reduce any parallel path of conduction with the superlattice. According to the well known relationship of consuming approximately 45% of the underlying silicon for a given oxide grown, the silicon cap layer may be greater than 45% of the grown gate oxide thickness plus a small incremental amount to account for manufacturing tolerances known to those skilled in the art. For the present example, and assuming growth of a 25 angstrom gate, one may use approximately 13–15 angstroms of silicon cap thickness.

Figure 6E:
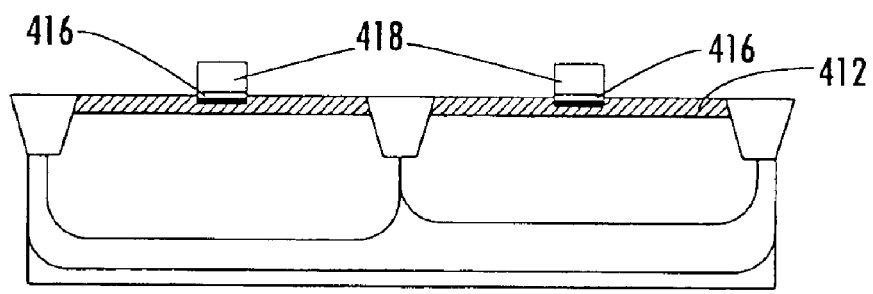

FIG. 6E depicts the devices after the gate oxide layers 416 and the gates 418 are formed. To form these layers, a thin gate oxide is deposited, and steps of poly deposition, patterning, and etching are performed. Poly deposition refers to low pressure chemical vapor deposition (LPCVD) of silicon onto an oxide (hence it forms a polycrystalline material). The step includes doping with P+ or As− to make it conducting and the layer is around 250 nm thick.

This step depends on the exact process, so the 250 nm thickness is only an example. The pattern step is made up of spinning photoresist, baking it, exposing it to light (photolithography step), and developing the resist. Usually, the pattern is then transferred to another layer (oxide or nitride) which acts as an etch mask during the etch step. The etch step typically is a plasma etch (anisotropic, dry etch) that is material selective (e.g. etches silicon 10 times faster than oxide) and transfers the lithography pattern into the material of interest.

Figure 6F:
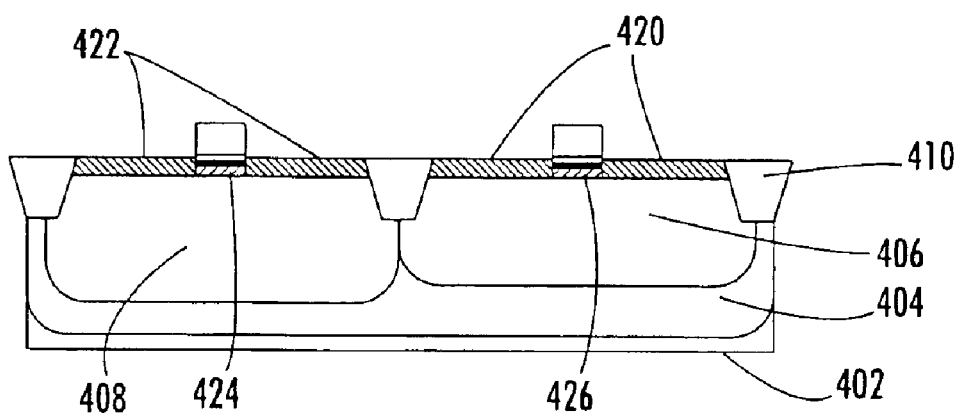

In FIG. 6F, lowly doped source and drain regions 420, 422 are formed adjacent the channels 424 and 426. These regions are formed using n-type and p-type LDD implantation, annealing, and cleaning. "LDD" refers to n-type lowly doped drain, or on the source side, p-type lowly doped source. This is a low energy/low dose implant that is the same ion type as the source/drain. An anneal step may be used after the LDD implantation, but depending on the specific process, it may be omitted. The clean step is a chemical etch to remove metals and organics prior to depositing an oxide layer.

Figure 6G:
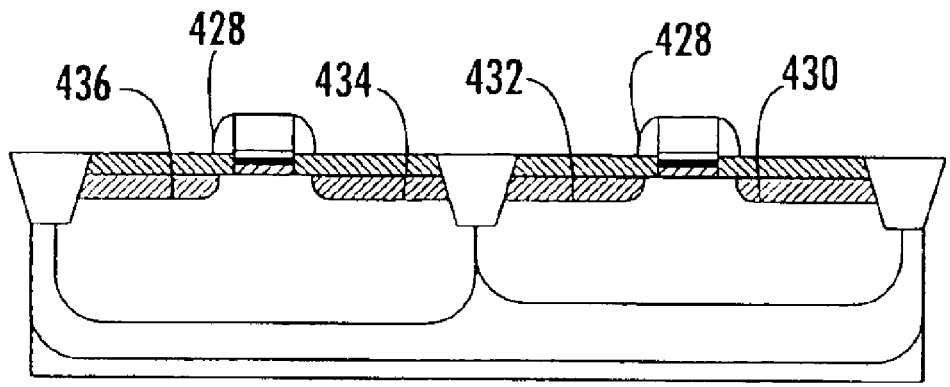
Figure 6H:
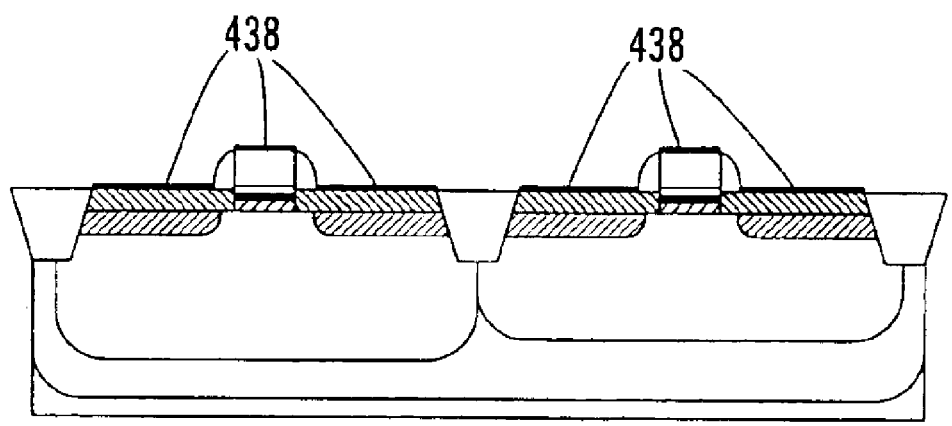

FIG. 6G shows the spacer 428 formation and the source and drain implants. An SiO$_2$ mask is deposited and etched back. N-type and p-type ion implantation is used to form the source and drain regions 430, 432, 434, and 436. Then the structure is annealed and cleaned. FIG. 6H depicts the self-aligned silicides 438 formation, also known as salicidation. The salicidation process includes metal deposition Ce. Ti), nitrogen annealing, metal etching, and a second annealing. This, of course, is just one example of a process and device in which the present invention may be used, and those of skill in the art will understand its application and use in many other processes and devices. In other processes and devices the structures of the present invention may be formed on a portion of a wafer or across substantially all of a wafer. In other processes and devices the structures of the present invention may be formed on a portion of a wafer or across substantially all of a wafer.

In accordance with another manufacturing process in accordance with the invention, selective deposition is not used. Instead, a blanket layer may be formed and a masking step may be used to remove material between devices, such as using the STI areas as an etch stop. This may use a controlled deposition over a patterned oxide/Si wafer. The use of an atomic layer deposition tool may also not be needed in some embodiments. For example, the monolayers may be formed using a CVD tool with process conditions compatible with control of monolayers as will be appreciated by those skilled in the art. Although planarization is discussed above, it may not be needed in some process embodiments. The superlattice structure may also formed prior to formation of the STI regions to thereby eliminate a masking step. Moreover, in yet other variations, the superlattice structure could be formed prior to formation of the wells, for example.

Considered in different terms, the method in accordance with the present invention may include forming a superlattice 25 including a plurality of stacked groups of layers 45a–45n. The method may also include forming regions for causing transport of charge carriers through the superlattice in a parallel direction relative to the stacked groups of layers. Each group of layers of the superlattice may comprise a plurality of stacked base semiconductor monolayers defining a base semiconductor portion and an energy band-modifying layer thereon. As described herein, the energy-band modifying layer may comprise at least one non-semiconductor monolayer constrained within a crystal lattice of adjacent base semiconductor portions so that the superlattice has a common energy band structure therein, and has a higher charge carrier mobility than would otherwise be present.

Other aspects relating to the present invention are disclosed in copending patent applications entitled "SEMICONDUCTOR DEVICE INCLUDING MOSFET HAVING BAND-ENGINEERED SUPERLATTICE", and "METHOD FOR MAKING SEMICONDUCTOR DEVICE INCLUDING BAND-ENGINEERED SUPERLATTICE", filed concurrently herein, and having respective Ser. Nos. 10/647,069, and 10/647,061, the entire disclosures of which are incorporated herein by reference. In addition, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A semiconductor device comprising:
   a superlattice comprising a plurality of stacked groups of layers; and
   each group of layers of said superlattice comprising a plurality of stacked base germanium monolayers defining a base germanium portion and an energy band-modifying layer thereon;
   said energy-band modifying layer comprising at least one non-semiconductor monolayer constrained within a crystal lattice of adjacent base germanium portions.

2. A semiconductor device according to claim 1 wherein said superlattice has a common energy band structure therein.

3. A semiconductor device according to claim 1 wherein said superlattice has a higher charge carrier mobility in at least one direction than would otherwise be present.

4. A semiconductor device according to claim 3 wherein the higher charge carrier mobility results from a lower conductivity effective mass for the charge carriers in the parallel direction than would otherwise be present.

5. A semiconductor device according to claim 4 wherein the lower conductivity effective mass is less than two-thirds the conductivity effective mass that would otherwise occur.

6. A semiconductor device according to claim 3 wherein the charge carriers having the higher mobility comprise at least one of electrons and holes.

7. A semiconductor device according to claim 1 wherein each energy band-modifying layer comprises oxygen.

8. A semiconductor device according to claim 1 wherein each energy band-modifying layer is a single monolayer thick.

9. A semiconductor device according to claim 1 wherein each base germanium portion is less than eight monolayers thick.

10. A semiconductor device according to claim 1 wherein each base germanium portion is two to six monolayers thick.

11. A semiconductor device according to claim 1 wherein said superlattice further has a substantially direct energy bandgap.

12. A semiconductor device according to claim 1 wherein said superlattice further comprises a base germanium cap layer on an uppermost group of layers.

13. A semiconductor device according to claim 1 wherein all of said base germanium portions are a same number of monolayers thick.

14. A semiconductor device according to claim 1 wherein at least some of said base germanium portions are a different number of monolayers thick.

15. A semiconductor device according to claim 1 wherein all of said base germanium portions are a different number of monolayers thick.

16. A semiconductor device according to claim 1 wherein each non-semiconductor monolayer is thermally stable through deposition of a next layer.

17. A semiconductor device according to claim 1 wherein each energy band-modifying layer comprises a non-semiconductor selected from the group consisting of oxygen, nitrogen, fluorine, and carbon-oxygen.

18. A semiconductor device according to claim 1 further comprising a substrate adjacent said superlattice.

19. A semiconductor device according to claim 1 wherein said superlattice further comprises at least one type of conductivity dopant therein.

20. A semiconductor device according to claim 1 wherein said superlattice defines a channel of a transistor.

21. A semiconductor device comprising
   a superlattice comprising a plurality of stacked groups of layers; and
   each group of layers of said superlattice comprising a plurality of stacked base germanium monolayers being less than eight monolayers to define a base germanium portion, and an energy band-modifying layer thereon;
   said energy-band modifying layer comprising at least one oxygen monolayer constrained within a crystal lattice of adjacent base germanium portions.

22. A semiconductor device according to claim 21 wherein said superlattice has a common energy band structure therein.

23. A semiconductor device according to claim 21 wherein said superlattice has a higher charge carrier mobility in at least one direction than would otherwise be present.

24. A semiconductor device according to claim 23 wherein the higher charge carrier mobility results from a lower conductivity effective mass for the charge carriers in the parallel direction than would otherwise be present.

25. A semiconductor device according to claim 23 wherein the charge carriers having the higher mobility comprise at least one of electrons and holes.

26. A semiconductor device according to claim 21 wherein each energy band-modifying layer is a single monolayer thick.

27. A semiconductor device according to claim 21 wherein each base germanium portion is less than eight monolayers thick.

28. A semiconductor device according to claim 21 wherein each base germanium portion is two to six monolayers thick.

29. A semiconductor device according to claim 21 wherein said superlattice further has a substantially direct energy bandgap.

30. A semiconductor device according to claim 21 wherein said superlattice further comprises a base germanium cap layer on an uppermost group of layers.

31. A semiconductor device according to claim 21 wherein all of said base germanium portions are a same number of monolayers thick.

32. A semiconductor device according to claim 21 wherein at least some of said base germanium portions are a different number of monolayers thick.

33. A semiconductor device according to claim 21 wherein all of said base germanium portions are a different number of monolayers thick.

34. A semiconductor device according to claim 21 further comprising a substrate adjacent said superlattice.

35. A semiconductor device according to claim 21 wherein said superlattice further comprises at least one type of conductivity dopant therein.

36. A semiconductor device according to claim 21 wherein said superlattice defines a channel of a transistor.

* * * * *

UNITED STATES PATENT AND TRADEMARK OFFICE
CERTIFICATE OF CORRECTION

PATENT NO.       : 6,891,188 B2
APPLICATION NO. : 10/717374
DATED            : May 15, 2005
INVENTOR(S)      : Mears et al.

It is certified that error appears in the above-identified patent and that said Letters Patent is hereby corrected as shown below:

| | |
|---|---|
| In the Drawings | Delete: FIG. 1<br>Insert: --New FIG. 1-- |

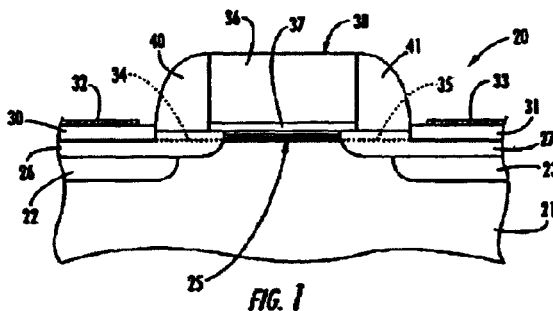

| | |
|---|---|
| Column 1, Line 42 | Delete: "on a binary"<br>Insert: --on binary-- |
| Column 1, Line 66 | Delete: "in a silicon"<br>Insert: --in silicon-- |
| Column 1, Line 67 | Delete: "electromuminescence"<br>Insert: --electroluminescence-- |
| Column 3, Line 4 | Delete "as may"<br>Insert: --as may be-- |
| Column 5, Line 11 | Delete: "gate 35"<br>Insert: --gate 38-- |
| Column 5, Line 60 | Delete: "gate 35"<br>Insert: --gate 38-- |
| Column 7, Line 63 | Delete: "from the both"<br>Insert: --from both-- |

UNITED STATES PATENT AND TRADEMARK OFFICE
CERTIFICATE OF CORRECTION

PATENT NO. : 6,891,188 B2
APPLICATION NO. : 10/717374
DATED : May 15, 2005
INVENTOR(S) : Mears et al.

It is certified that error appears in the above-identified patent and that said Letters Patent is hereby corrected as shown below:

Column 9, Lines 44-46  Delete: "In other processes and devices the structures of the present invention may be formed on a portion of a wafer or across substantially all of a wafer."

Column 9, Line 59  Delete: "also formed"
Insert: --also be formed--

Signed and Sealed this

Twenty-sixth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,891,188 B2
APPLICATION NO. : 10/717374
DATED : May 10, 2005
INVENTOR(S) : Mears et al.

It is certified that error appears in the above-identified patent and that said Letters Patent is hereby corrected as shown below:

In the Drawings    Delete: FIG. 1
Insert: New FIG. 1

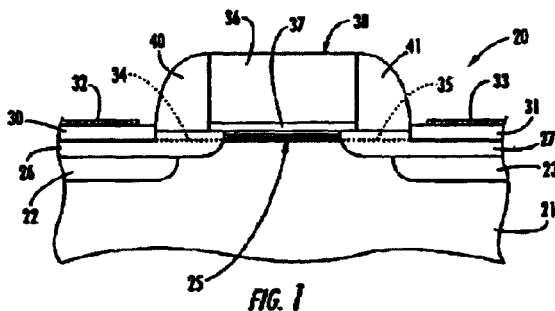

Column 1, Line 42    Delete: "on a binary"
Insert: --on binary--

Column 1, Line 66    Delete: "in a silicon"
Insert: --in silicon--

Column 1, Line 67    Delete: "electromuminescence"
Insert: --electroluminescence--

Column 3, Line 4    Delete "as may"
Insert: --as may be--

Column 5, Line 11    Delete: "gate 35"
Insert: --gate 38--

Column 5, Line 60    Delete: "gate 35"
Insert: --gate 38--

Column 7, Line 63    Delete: "from the both"
Insert: --from both--

UNITED STATES PATENT AND TRADEMARK OFFICE
CERTIFICATE OF CORRECTION

PATENT NO. : 6,891,188 B2
APPLICATION NO. : 10/717374
DATED : May 10, 2005
INVENTOR(S) : Mears et al.

It is certified that error appears in the above-identified patent and that said Letters Patent is hereby corrected as shown below:

Column 9, Lines 44-46   Delete: "In other processes and devices the structures of the present invention may be formed on a portion of a wafer or across substantially all of a wafer."

Column 9, Line 59   Delete: "also formed"
Insert: --also be formed--

This certificate supersedes Certificate of Correction issued September 26, 2006.

Signed and Sealed this

Twenty-first Day of November, 2006

JON W. DUDAS
*Director of the United States Patent and Trademark Office*